United States Patent [19]

Lewis

[11] 4,091,406
[45] May 23, 1978

[54] COMBINATION GLASS/LOW TEMPERATURE DEPOSITED $Si_wN_xH_yO_z$ PASSIVATING OVERCOAT WITH IMPROVED CRACK AND CORROSION RESISTANCE FOR A SEMICONDUCTOR DEVICE

[75] Inventor: William Newman Lewis, Bridgewater, N.J.

[73] Assignee: RCA Corporation, New York, N.Y.

[21] Appl. No.: 737,848

[22] Filed: Nov. 1, 1976

[51] Int. Cl.$^2$ ............................................. H01L 29/34
[52] U.S. Cl. ...................................... 357/54; 357/71; 357/73; 427/94
[58] Field of Search ....................... 357/54, 23, 71, 73; 427/93, 94, 95

[56] References Cited

U.S. PATENT DOCUMENTS

| | | | |
|---|---|---|---|
| 3,422,321 | 1/1969 | Tombs | 357/23 |
| 3,424,661 | 1/1969 | Androshuk et al. | 357/54 |
| 3,607,697 | 9/1971 | Shirn et al. | 357/54 |
| 3,635,774 | 1/1972 | Ohta | 357/54 |
| 3,745,428 | 7/1973 | Miswa et al. | 357/54 |
| 3,765,935 | 10/1973 | Rand et al. | 357/54 |
| 3,838,442 | 9/1974 | Humphreys | 357/54 |
| 3,967,310 | 6/1976 | Horiuchi et al. | 357/54 |
| 4,001,871 | 1/1977 | Tsunemitsu | 357/54 |
| 4,001,872 | 1/1977 | Khajezadeh | 357/54 |

OTHER PUBLICATIONS

P. Burkhardt, "Composite Silicon Dioxide–Silicon Oxynitride Insulating Layer," IBM Tech. Discl. Bull., vol. 13, #1, Jun. 1970, p. 21.
G. Ackermann et al., "Process for Deposition of Oxynitride, "IBM Tech. Discl. Bull., vol. 15, #12, May 1973, p. 3888.

*Primary Examiner*—Joseph E. Clawson, Jr.
*Attorney, Agent, or Firm*—H. Christoffersen; R. P. Williams; T. H. Magee

[57] ABSTRACT

A semiconductor device including a body of semiconductor material with a metallic conductor disposed thereon has a combination glass/low-temperature-(typically 300° C) deposited $Si_wN_xH_yO_z$ passivating overcoat with improved crack and corrosion resistance. A primary passivating layer including $Si_3N_4$ is between the semiconductor surface and the metallic conductor, and the glass is formed over the metallic conductor, with the low-temperature-deposited nitride over the glass.

5 Claims, 1 Drawing Figure

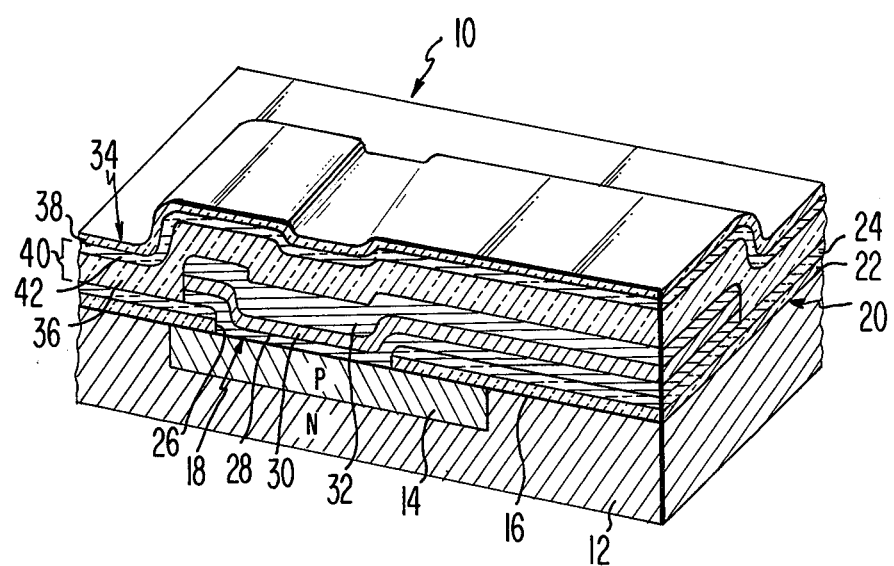

COMBINATION GLASS/LOW TEMPERATURE DEPOSITED SI$_w$N$_x$H$_y$O$_z$ PASSIVATING OVERCOAT WITH IMPROVED CRACK AND CORROSION RESISTANCE FOR A SEMICONDUCTOR DEVICE

The Government has rights in this invention pursuant to Contract No. N00039-76-C-0240 awarded by the Department of the Navy.

This invention relates to a passivating overcoat including a glass layer which is disposed over a metallic conductor of a semiconductor device.

In manufacturing semiconductor devices, processing steps are generally performed in order to protect the device against adverse ambient conditions, such as high humidity, corrosive vapors, and mechanical abrasion. Such processing steps are typically labeled as "device passivation" which can be grouped into two main types: (1) primary passivation of the semiconductor device surface at and near the termination of a PN junction, and (2) secondary passivation of the essentially finished, metallized device. Both types of passivation are of great practical importance and hence require a high-quality dielectric material that must serve several important functions. The main difference between the two is that primary passivation must effectively protect the immediate semiconductor surface from deleterious contaminants such as ions, metals, and moisture, whereas secondary passivation must protect the entire device surface — both oxide and metal areas — with an overcoating that immobilizes ionic impurities, prevents the penetration of moisture and harmful gases, and at the same time is sufficiently rugged to provide a high degree of mechanical protection. A typical primary passivating overcoat is disclosed in U.S. Pat. No. 3,597,667, issued to Horn on Aug. 3, 1971, wherein a combination oxide/silicon nitride passivating overcoat is disposed between the semiconductor surface and the device metallization. The layer of silicon nitride (Si$_3$N$_4$) is deposited prior to forming the metallization, preferably by the pyrolysis of a silicon-containing-hydrocarbon gas at high temperatures (see U.S. Pat. No. 3,917,495 issued to Horn on Aug. 16, 1974).

One of the earliest forms of secondary passivation is the use of a hermetic metal or ceramic package. But with the demand to increase the packing density of chips in circuitry, hermetic packages become unwieldy and expensive. This has lead to the packaging of many semiconductor devices and circuit modules in organic plastic encapsulating materials which are not the equivalent of a hermetic seal. Unless individual chips are sealed at the chip level, electrical parameters often drift with time, especially during operation at high humidity. Although improvements are being made in plastic packaging materials, there are inherent limitations in encapsulating organic compounds with respect to their purity and permeability to moisture and gases. Consequently, improvements in passivation at the chip level of the semiconductor device are highly desirable. Improved secondary passivation is commonly accomplished with glass materials.

Glass passivation is also used in hermetic devices for several reasons. It covers and insulates the metallization interconnect pattern, preventing possible shorting by loose conducting particles in the hermetic can. If the hermetic enclosure should develop a leak, the glass passivation provides an added safety margin for reliability. The mechanical scratch protection and ambient protection provided by the glass passivation of the semiconductor wafer during processing, dicing, mounting, and wire-bounding of semiconductor wafers and pellets is of paramount importance to safeguard reliability and to maintain high product yield.

Glass frit has been utilized to form a vacuumtight seal in electron tube applications where portions of a metallic pin are adjacent a glass structure. In order to form an airtight seal between the glass and the protruding metal pins, such pins have been coated with silicon nitride (Si$_3$N$_4$) by heating the pins in an atmosphere consisting essentially of silicon hydride, ammonia, and argon at about 800° C. The pins are then placed in a mold having a cavity shaped according to the desired glass structure, and the cavity is filled with glass frit. The mold is next heated to a relatively high temperature of about 700° C, at which temperature the glass frit fuses together and is heat-sealed to the Si$_3$N$_4$ coating. This heat-sealing process is described in U.S. Pat. No. 3,635,510 issued to Stoller et al. on Jan. 18, 1972, and assigned to RCA Corporation. Such a high temperature heat-sealing process is not used for semiconductor devices which have the device metallization already in place, since such high temperatures would exceed the eutectic temperature at which the metallic portions of the devices would be likely to alloy with the semiconductor material. Also, the glass-like layer used for semiconductor device passivation is typically chemically vapor-deposited over the entire surface of the semiconductor wafer at a temperature below the metal-semiconductor eutectic temperature.

The terms "glassing" and "glass passivation" are commonly used to denote the process in which a glasslike, amorphous, inorganic dielectric layer is formed over the surface of a completed semiconductor wafer. The sequence for glass passivation normally consists of deposition of the dielectric layer over the entire surface of the wafer, which was previously metallized and the metal delineated, followed by photolithographic delineation to remove glass from the central region of bonding pads and from scribe line areas. Typical glass layers include both silicon dioxide (SiO$_2$) layers and modified silicon dioxide layers, such as borosilicate glass layers (layers containing chemically-bonded boron trioxide, B$_2$O$_3$) and phosphosilicate glass layers (layers containing chemically-bonded phosphorus pentoxide, P$_2$O$_5$). Such glass layers are generally deposited over the entire surface of the semiconductor wafer using known chemical vapor-depositing techniques. A complete description of one process for chemically vapor-depositing a silicate glass layer is described in U.S. Pat. No. 3,481,781, issued to Werner Kern on Dec. 2, 1969, and assigned to RCA Corporation.

In semiconductor devices having glass layers deposited over metal, cracks and pinholes frequently form in such glass layers when the devices are heated. Such glass layers are typically deposited over metallic conductors such as aluminum or gold, in which the gold may be the top layer of a trimetallization system including a bottom layer of titanium and a middle layer of either platinum or palladium. Glass layers deposited over gold exhibit poor adhesion due to the fact that gold does not readily form a surface oxide that can promote adhesion. As a result, glass layers deposited over gold are of relatively poor quality and invariably crack or peel when heated to about 320° C during subsequent processing steps. Although glass layers deposited over aluminum condutors exhibit better adhesion and less cracking providing the deposition conditions and composition are carefully controlled, such layers may also crack when heated to higher temperatures, such as 450° C. Since cracking degrades the passivating qualities of glass layers, it is highly desirable to have a passivating overcoat which provides better protection for the semiconductor device.

In the drawing:

The FIGURE is a perspective cross-sectional view showing one embodiment of the novel passivating overcoat of the present invention.

Referring to the FIGURE there is shown a semiconductor device 10 comprising a silicon wafer 12, initially of one type conductivity, N type as shown in the present example. The wafer 12 typically includes various regions of N and P type conductivity of which only one P type region 14 is shown in the FIGURE. Above a surface 16 of the wafer 12 is disposed a metallic conductor 18 which interconnects the P type region 14 and various other regions (not shown) into a desired circuit configuration. A primary passivating overcoat 20, comprising typically a layer 22 of silicon dioxide above which is disposed a layer 24 of silicon nitride, is disposed on the surface 16 of the wafer 12. The silicon dioxide layer 22 may be thermally grown by heating the wafer 12 in an oxidizing atmosphere in known manner, while the layer 24 of silicon nitride is typically chemically vapor-deposited (CVD) at high temperature by the pyrolytic reaction of a silicon-containing gas, such as silane ($SiH_4$) or silicon tetrachloride ($SiCl_4$), with a nitrogen-containing gas, such as ammonia ($NH_4$), also in known manner. An opening 26 is formed through the layers 22 and 24 to expose a portion of the surface 16 of the wafer 12 where the conductor 18 is to make contact thereto.

The metallic conductor 18 shown in the FIGURE is a multilayered metallization system comprising a first layer 28 of deposited titanium, a second layer 30 of deposited platinum or palladium, and a third layer 32 of deposited gold. All of these layers function as they do in a conventional beam lead system of the type described in U.S. Pat. No. 3,287,612, which issued to Lepselter on Nov. 22, 1966. The advantage of using such a trimetal system is that the gold layer 32 is highly conductive and corrosion-resistant, the layer 28 of titanium forms an adherent bond with the silicon wafer 12 to help prevent lifting of the metallic conductor 18 from the surface 16 thereof, while the layer 30 of platinum or palladium acts as a barrier metal to help insure that the gold does not penetrate to the silicon wafer 12, since this is generally undesirable. Although a trimetal system is illustrated for the metallic conductor 18 shown in the FIGURE, such a conductor may comprise simply a single metallic layer, such as a layer of aluminum.

A secondary passivating overcoat 34 is disposed over the top of the wafer 12 including the unmetallized portions of the layer 24 and the exposed portions of the conductor 18. In accordance with the present invention, the passivating overcoat 34 comprises a combination glass/nitride structure which includes a glass layer 36 disposed over the layer 24 and the exposed portions of the conductor 18, and a low-temperature-deposited nitride layer 38 disposed over the glass layer 36. The expression "low-temperature-deposited" means a nitride layer 38 deposited at a temperature below the eutectic temperature at which the metallic conductor 18 may alloy with the semiconductor material such as, for example, the Au-Si eutectic temperature of about 370° C. The nitride layer 38 has a typical thickness of between about 500A and about 15,000A, whereas the glass layer 36 is relatively thicker and has a thickness of between about 3,000A and about 30,000A. Referring to the FIGURE, there is illustrated one embodiment for such a combination passivating overcoat 34 wherein the glass layer 36 may comprise the first layer of a multilayered glass structure 40 which includes a second glass layer 42. Typically, one of the glass layers such as, for example, the glass layer 36, may be phosphosilicate glass (PSG), while the other glass layer, i.e., the second glass layer 42, may be a layer of undoped silicon dioxide. Preferably, the PSG layer has a thickness of between about 10,000A and about 15,000A, and the silicon dioxide layer has a thickness of between about 1,000A and about 2,000A. If desired, the second glass layer 42 may be eliminated, and the nitride layer 38 may be disposed directly over the glass layer 36.

The method used for depositing the nitride layer 38 is limited to a relatively low-temperature process due to the fact that the device metallization is already in place at the time that the nitride layer 38 is to be formed. For example, where the conductor 18 comprises gold, the nitride layer 38 should be deposited at a temperature of between about 50° C and about 350° C, since any gold that may contact the silicon through imperfections in the platinum or palladium barrier layer 30 may alloy with the silicon at the Au-Si eutectic temperature of about 370° C. Although the Al-Si eutectic temperature of about 577° C is slightly higher, a nitride layer cannot be chemically vapor-deposited over aluminum because a high deposition temperature of about 850° C is required in the chemical vapor-deposition processes. Consequently, nitride layers which are chemically vapor-deposited generally have to be deposited prior to forming the device metallization.

In the preferred embodiment, the nitride layer 38 is deposited at relatively low temperature by an rf glow discharge plasma reaction in an atmosphere selected from the group consisting of silane and nitrogen, silane and ammonia, and silane, nitrogen and ammonia. For further information on the known use of a plasma reaction in depositing a nitride layer, see Rosler et al., "A Production Reactor for Low Temperature Plasms-Enhanced Silicon Nitride Deposition," Solid State Technology, June 1976, pages 45 to 50. The nitride layer 38 may also be deposited at low temperature by either reactive rf sputtering in nitrogen using a silicon target, or direct rf sputtering using a silicon nitride target. Such rf sputtering techniques are also known in the art; for further information see J. L. Vossen, "Control of Film Properties by rf-Sputtering Techniques," *Journal of Vacuum Science and Technology*, Vol. 8, No. 5, September/October 1971, pages S12 to S30.

The nitride layer 38, when deposited by glow discharge plasma reaction from silane and nitrogen, with or without ammonia, at typically 300° C, is not stoichiometric $Si_3N_4$ but comprises an amorphous, and probably a polymeric, chemical compound having the formula $Si_wN_xH_yO_z$, wherein $w$, $x$, $y$ and $z$ are integers other than zero. The proportion of these elements differs substantially with deposition conditions, giving rise to nitride layers with wisely ranging properties. This conclusion is based to a large extent on infrared spectroscopic data that reveal the presence of Si-N, Si-H, Si-NH - Si, Si-OH, and possibly Si-O and N-H groups.

Low-temperature nitride layers, whether deposited by plasma reaction, reactive rf sputtering, or direct rf sputtering contain background gases as solid solutions or loosely-bonded molecules which tend to make such nitride layers thermodynamically unstable. Any agent, such as heat or impurities, which disturbs this metastable state may cause spontaneous release of the dissolved gas, resulting in blisters or bubbles which degrade the integrity of the secondary passivating overcoat. It has been observed that heating of such nitride layers may cause blistering due to outgassing of the dissolved background gases, such as argon which may become dissolved in nitride layers deposited by rf sputtering. In the preferred embodiment of the present invention, a controlled amount of oxygen or oxygen-containing gas is bled into the reaction chamber so that the low-temperature nitride layer 38 being formed will contain silicon oxynitride. It has been found that nitride layers containing substantial amounts of Si-O linkages are much less prone to blistering, and appear to be much more stable, especially during subsequent heating operations.

The combination glass/nitride passivating overcoat 34 provides an excellent protective structure which exhibits a greatly improved resistance to cracking and peeling, thereby ensuring better reliability for semiconductor devices. Experiments have shown that the adherence of a glass layer to a metallic conductor, especially a layer of gold, is initially acceptable, but deteriorates after the layer is exposed for a short period of time to ambient air which is relatively humid, resulting in peeling or cracking of the glass layer. I have discovered that forming the low-temperature-deposited nitride layer over the glass layer away from the device, before the glass layer has been exposed to such humidity, prevents the degradation of the adherence between the glass layer and metallic conductor. The nitride layer acts as a moisture diffusion barrier which seals off the underlying glass layer from the ambient air which may contain undesirable moisture. Although a low-temperature-deposited nitride layer by itself would not provide adequate dielectric protection needed for effective overcoat passivation because such nitride layers exhibit poor structural integrity, a combination glass/nitride structure provides a passivating overcoat which offers substantially improved integrity against cracking. The underlying glass layer not only provides ample dielectric and mechanical protection for the semiconductor device but also acts as an effective getter for harmful ion impurities such as, for example, sodium ions. The overlying nitride layer acts as a sealant for the underlying glass layer which prevents the degradation in structural quality of the glass layer, and thereby allows the glass layer to retain its adherence to the underlying metallic conductor.

What is claimed is:

1. In a semiconductor device having a body of semiconductor material having a surface, a primary passivating layer of insulating material disposed on said surface, said primary passivating layer including a layer of silicon nitride ($Si_3N_4$), a metallic conductor disposed thereon and a passivating overcoat including a glass layer disposed over said conductor, the improvement comprising said passivating overcoat further including a low-temperature-deposited nitride layer disposed over said glass layer, said low-temperature-deposited nitride layer comprising a chemical compound having the formula $Si_wN_xH_yO_z$, wherein w, x, y and z are integers other than zero, and being deposited at a temperature below the eutectic temperature at which said metallic conductor begins to alloy with said semiconductor material.

2. A semiconductor device as defined in claim 1 wherein said low-temperature-deposited nitride layer has a thickness of between about 500A and about 15,000A.

3. A semiconductor device as defined in claim 1 wherein said glass layer is phosphosilicate glass and has a thickness of between about 3,000A and about 30,000A.

4. A semiconductor device as defined in claim 1 wherein said conductor comprises a layer of aluminum.

5. A semiconductor device as defined in claim 1 wherein said conductor comprises a first layer of titanium, a second layer of one of platinum and palladium, and a third layer of gold, said gold layer being adjacent to said glass layer.

* * * * *